US010804431B2

(12) United States Patent
Chang (10) Patent No.: US 10,804,431 B2
(45) Date of Patent: Oct. 13, 2020

(54) POLARIZATION-SELECTING NANO LIGHT-EMITTING DIODES

(71) Applicant: ACADEMIA SINICA, Taipei (TW)

(72) Inventor: Yun-Chorng Chang, Taipei (TW)

(73) Assignee: ACADEMIA SINICA, Taipei (TW)

( * ) Notice: Subject to any disclaimer, the term of this patent is extended or adjusted under 35 U.S.C. 154(b) by 0 days.

(21) Appl. No.: 16/243,645

(22) Filed: Jan. 9, 2019

(65) Prior Publication Data

US 2019/0245113 A1    Aug. 8, 2019

Related U.S. Application Data

(60) Provisional application No. 62/625,580, filed on Feb. 2, 2018.

(51) Int. Cl.
*H01L 33/08* (2010.01)
*H01L 33/06* (2010.01)
(Continued)

(52) U.S. Cl.
CPC .............. *H01L 33/08* (2013.01); *H01L 33/06* (2013.01); *H01L 33/24* (2013.01); *H01L 33/32* (2013.01); *H01L 33/42* (2013.01)

(58) Field of Classification Search
CPC ......... H01L 33/08; H01L 33/24; H01L 33/32; H01L 33/42; H01L 33/06; H01L 33/20; H01L 33/16
See application file for complete search history.

(56) References Cited

U.S. PATENT DOCUMENTS

| 2009/0027773 A1* | 1/2009 | Kawakami ........... G02B 5/3058 359/485.05 |
| 2017/0138549 A1 | 5/2017 | Do et al. |
| 2018/0231843 A1* | 8/2018 | Park .................. G02F 1/133509 |

OTHER PUBLICATIONS

Zhuang et al. ("Great Enhancement in the Excitonic Recombination and Light Extraction of Highly Ordered InGaN/GaN Elliptic Nanorod Arrays on a Wafer Scale," Nanotechnology 27, 2016) (Year: 2016).*

(Continued)

*Primary Examiner* — Yasser A Abdelaziez
(74) *Attorney, Agent, or Firm* — Muncy, Geissler, Olds & Lowe, P.C.

(57) ABSTRACT

Current-injecting nanorod LEDs are demonstrated to emit linear polarized light that is detected from the backside of the sample. The polarization ratio of the electroluminescence reaches 71% when the length of the minor axis is as small as 150 nm. Electromagnetic simulation confirms the occurrence of the polarization selectivity especially when the length of the minor axis is down to 150 nm. The destructive interference between the light directly from light source and the reflected light by the top metal interface is the origin of the selectivity. Emission with the polarization perpendicular to the nanorods is extracted out of the nanorods and the remaining light with the other polarization transmits to the substrate. The linearly polarized light can be also detected from the front side of the sample if the conductive pad is transparent. The simulation also suggests that it is possible to obtain circularly or elliptically polarized light by tuning the height of the nanorods. These observed phenomena could also apply to fin-shaped nanowall LED. The results in this study will be beneficial for applications that required linearly or circularly polarized light especially for devices that are not suitable to use an external polarizer.

16 Claims, 8 Drawing Sheets

(51) Int. Cl.
*H01L 33/42* (2010.01)
*H01L 33/32* (2010.01)
*H01L 33/24* (2010.01)

(56) References Cited

OTHER PUBLICATIONS

Zhu et al. ("Shape dependent resonance light scattering properties of gold nonrods," Material Science and Engineering, B 121, pp. 199-203, 2005) (Year: 2005).*
Nakamura, S.; Mukai, T.; Senoh, M., "Candela-Class High-Brightness Ingan/Algan Double-Heterostructure Blue-Light-Emitting Diodes". Appl Phys Lett 1994, 64 (13), pp. 1687-1689.
Nakamura, S.; Senoh, M.; Nagahama, S.; Iwasa, N.; Yamada, T.; Matsushita, T.; Kiyoku, H.; Sugimoto, Y., "InGaN-based multi-quantum-well-structure laser diodes". Jpn J Appl Phys 2 1996, 35 (1b), pp. L74-L76.
Nakamura, S.; Krames, M. R., "History of Gallium-Nitride-Based Light-Emitting Diodes for Illumination". P Ieee 2013, 101 (10), pp. 2211-2220.
Cho, J.; Park, J. H.; Kim, J. K.; Schubert, E. F., "White light-emitting diodes: History, progress, and future". Laser Photonics Rev 2017, 11 (2), pp. 1-17.
Pimputkar, S.; Speck, J. S.; DenBaars, S. P.; Nakamura, S., "Prospects for LED lighting". Nat Photonics 2009, 3 (4), pp. 180-182.
Schubert, M. F.; Chhajed, S.; Kim, J. K.; Schubert, E. F.; Cho, J., "Polarization of light emission by 460 nm GaInN/GaN light-emitting diodes grown on (0001) oriented sapphire substrates". Appl Phys Lett 2007, pp. 91 (5); pp. 1-3.
Paskov, P. P.; Paskova, T.; Holtz, P. O.; Monemar, B., "Anisotropy of the free exciton emission in GaN grown on a-plane sapphire". Physica Status Solidi a-Applied Research 2002, 190 (1), pp. 75-79.
Gardner, N. F.; Kim, J. C.; Wierer, J. J.; Shen, Y. C.; Krames, M. R., "Polarization anisotropy in the electroluminescence of m-plane InGaN—GaN multiple-quantum-well light-emitting diodes". Appl Phys Lett 2005, 86 (11), pp. 1-4.
Brinkley, S. E.; Lin, Y. D.; Chakraborty, A.; Pfaff, N.; Cohen, D.; Speck, J. S.; Nakamura, S.; DenBaars, S. P., "Polarized spontaneous emission from blue-green m-plane GaN-based light emitting diodes". Appl Phys Lett 2011, 98 (1), pp. 1-4.
Cho, J.; Meyaard, D. S.; Ma, M.; Schubert, E. F., GaInN-based light emitting diodes embedded with wire grid polarizers. Jpn J Appl Phys 2015, 54 (2), pp. 1-5.
Zhuang, Z.; Li, Y.; Liu, B.; Guo, X.; Dai, J. P.; Zhang, G. G.; Tao, T.; Zhi, T.; Xie, Z. L.; Ge, H. X.; Shi, Y.; Zheng, Y. D.; Zhang, R., "Optical polarization characteristics of c-plane InGaN/GaN asymmetric nanostructures". J Appl Phys 2015, 118 (23), pp. 1-8.
Zhuang, Z.; Guo, X.; Liu, B.; Hu, F. R.; Dai, J. P.; Zhang, Y.; Li, Y.; Tao, T.; Zhi, T.; Xie, Z. L.; Ge, H. X.; Wang, X. Y.; Xiao, M.; Wang, T.; Shi, Y.; Zheng, Y. D.; Zhang, R., "Great enhancement in the excitonic recombination and light extraction of highly ordered InGaN/GaN elliptic nanorod arrays on a wafer scale". Nanotechnology 2016, 27 (1), pp. 1-10.
Chen, H. Y.; Yang, Y. C.; Lin, H. W.; Chang, S. C.; Gwo, S., "Polarized photoluminescence from single GaN nanorods: Effects of optical confinement". Opt Express 2008, 16 (17), pp. 13465-13475.
Lu, Y. J.; Lin, H. W.; Chen, H. Y.; Yang, Y. C.; Gwo, S., "Single InGaN nanodisk light emitting diodes as full-color subwavelength light sources". Appl Phys Lett 2011, 98 (23), pp. 1-4.
Zhao, C.; Ng, T. K.; Wei, N. N.; Prabaswara, A.; Alias, M. S.; Janjua, B.; Shen, C.; Ooi, B. S., "Facile Formation of High-Quality InGaN/GaN Quantum-Disks-in-Nanowires on Bulk-Metal Substrates for High-Power Light-Emitters". Nano Lett 2016, 16 (2), pp. 1056-1063.
Li, Q. M.; Westlake, K. R.; Crawford, M. H.; Lee, S. R.; Koleske, D. D.; Figiel, J. J.; Cross, K. C.; Fathololoumi, S.; Mi, Z. T.; Wang, G. T., "Optical performance of top-down fabricated InGaN/GaN nanorod light emitting diode arrays". Opt Express 2011, 19 (25), pp. 25528-25534.
Ke, M. Y.; Wang, C. Y.; Chen, L. Y.; Chen, H. H.; Chiang, H. L.; Cheng, Y. W.; Hsieh, M. Y.; Chen, C. P.; Huang, J. J., "Application of Nanosphere Lithography to LED Surface Texturing and to the Fabrication of Nanorod LED Arrays". Ieee J Sel Top Quant 2009, 15 (4), pp. 1242-1249.
Zhao, C.; Ng, T. K.; Prabaswara, A.; Conroy, M.; Jahangir, S.; Frost, T.; O'Connell, J.; Holmes, J. D.; Parbrook, P. J.; Bhattacharya, P.; Ooi, B. S., "An enhanced surface passivation effect in InGaN/GaN disk-in-nanowire light emitting diodes for mitigating Shockley-Read-Hall recombination". Nanoscale 2015, 7 (40), pp. 16658-16665.
Meng-Cheng Chou; Chia-Yi Lin; Bo-Lin Lin; Chang-Han Wang; Shih-Hui Chang; Wei-Chih Lai; Kun-Yu Lai; Yun-Chorng Chang, "Polarization-Selecting III-Nitride Elliptical Nanorod Light-Emitting Diodes Fabricated with Nanospherical-Lens Lithography". ACS Nano 2018, 12, pp. 8748-8757.

* cited by examiner

POLARIZATION-SELECTING NANO LIGHT-EMITTING DIODES

CROSS REFERENCE OF RELATED APPLICATIONS

This non-provisional application claims priority to U.S. provisional patent application Ser. No. 62/625,580 filed on Feb. 2, 2018. This and all other extrinsic materials discussed herein are hereby incorporated by reference in their entirety.

BACKGROUND

Technical Field

This invention herein relates to nano light-emitting diodes (LEDs), especially relates to the rod-shaped or fin-shaped LEDs that emit linearly, elliptically, and circularly polarized light.

Related Arts

Light-emitting diodes (LEDs) have experienced major research advancements during the past two decades after the advent of III-nitride blue LEDs.[1-3] LEDs now are very efficient and bright with relative long lifetime and have become the most important components in several lighting technologies, including general indoor lighting, car headlights and backlighting for liquid crystal displays (LCDs).[4-5] One of the major deficiencies for LEDs is that the emitted light is un-polarized, which cannot be used directly for applications requiring polarized light, such as LCD backlighting. In these applications, external polarizer is necessary to absorb the light with the undesired polarization. Roughly 50% of light is lost during the process resulting rather low energy efficiency. The absorbed light usually transfers into thermal energy and heats up the device, which usually further downgrades the devices' performance. As a result, finding a way to fabricated LEDs that emit polarized light will help to resolve many existing problems. In addition, the external polarizer is usually rather large compared to the size of the LEDs and only one polarization can be defined using one polarizer. Therefore, individual LED with embedded polarization selectivity would allow the design of light sources with various preferred polarization directions.

Several approaches have been proposed to obtain polarized light from an individual III-nitrides LED. For example, it has been reported that the light emitted from the side facet of a regular III-nitrides LED grown on c-plane sapphire is highly polarized.[6] However, specially designed package is required to allow light only come out from the side facet. Similarly, III-nitrides multiple quantum wells grown on non-polar or semi-polar substrates can also emit highly polarized light.[7-9] But the non-polar or semi-polar substrates are still very expensive and the quality of the thin film grown on these substrates is still very poor. In addition, LED with embedded wire grid polarizers are also demonstrated and exhibit a high polarization selectivity.[10] Asymmetric nanostructures made from III-Nitrides semiconductors, such as nanowires or nano-gratings, has been demonstrated to emit polarized light, too.[11-14] These nanostructures are either fabricated via the bottom-up or top-down approaches. For the bottom-up approach, nanowires are typically grown with a plasma-assisted molecular beam epitaxy system (PAMBE).[13-15] These nanowires are usually very small in diameter (~30 nm) and usually exhibit a symmetry cross-section. In order to observe the polarized emission from the top, these nanowires have to be positioned horizontally which indicates that these nanowire have to be removed from the growth substrate and placed on the target substrate. However, it is extremely difficult to make electric contacts to both ends of the nanowires with high yields because it is usually a random process for the re-positioning of nanowires. The top-down approach usually includes nano-patterning of metal hard masks and the subsequent dry etch. However, the dry etch usually creates defects on the etch facet and degrade the device's performance. It has been proposed that an addition wet etch can effectively remove these defects created by dry etch.[16] The top-down approach can be used to fabricate asymmetric nanorods and the smallest feature is usually around 100 nm. These relatively large nanorods are physical strongly enough to remain on the growth substrates, which implies that only one electric contact is necessary. In addition, the locations of the nanorods are pre-defined so fabricating the top contacts can be achieved. Finding reliable methods to fabricate electric contacts and obtain electroluminescence (EL) would help these special LEDs finding suitable industrial application. Several methods have been demonstrated to connect the top electrode of individual vertically aligned nanorods.[17-18] However, polarized emissions from these nanostructures were mostly excited optically not electrically regardless the fabrication approaches. For industrial applications, it is also very crucial that the fabricate technique are both large-scale and high-throughput. Thus, precision nanofabrication methods, such as EBL and FIB, are not favorable ways to use.

Emission from conventional light emitting diode (LED) is not polarized. However, polarized light source is required for a lot of recent optoelectronic devices. For example, the backlighting module of a liquid crystal display (LCD) panel requires a linearly polarized light so the liquid crystal module can be used to control the polarization direction at the output. This is usually accomplished by employed a linear polarizer to absorb the light with the unwanted polarization direction. Roughly 50% of the total emission from an un-polarized LED is wasted during this process. Back lighting module can also use a circularly polarized (CP) light. LCDs with CP illumination exhibit steeper transmission-voltage characteristics and higher brightness compared to LCDs illuminated with linearly polarized light. The other display technology that uses polarized light source is three-dimensional (3D) display that employs the polarization selecting method. Two different images are shown in the 3D display and they exhibit different polarization states. 3D glasses with a set of polarizer installed are necessary to view the 3D images. These display required polarization control for each pixel, which is not easily achieved using conventional linear polarizer. Individual LED that can emit polarized light can solve these problems.

SUMMARY

In this disclosure, the light emitter is patterned to an elliptical nano-rods or fin-shaped nano-walls with the narrowest dimension to be less than half of the emitting wavelength. In these emitters, the emitted light with the polarization direction parallel to the narrowest dimension travels at a different speed compared to the other polarization direction. By controlling the sizing parameters of the nanostructures, the polarization states of the emitting light can be changed from linearly to elliptically or circularly polarized light. Each LED can have its only polarization states.

To achieve the above objective, one embodiment of the invention discloses a light-emitting diode which comprises a substrate and an elliptical nano-rod array. The elliptical array is disposed on the substrate and comprises a plurality of elliptical nanorods which are perpendicular to the substrate. Each nano-rod comprises a first conductive layer, an active layer disposed on the first conductive layer, and a second conductive layer disposed on the active layer.

To achieve the above objective, according to another embodiment of the present disclosure, another light emitting diode is also provided. The light emitting diode comprises a substrate and a plurality fin-shaped nano-walls. The fin-shaped nano-walls are disposed on the substrate and are perpendicular to the substrate. Each fin-shaped nano-wall comprises a first conductive layer, an active layer disposed on the first conductive layer, and a second conductive layer disposed on the active layer.

In one embodiment, the minor axis or the linewidth of each elliptical nano-rod or fin-shaped nano-wall, respectively, is smaller than half of the working wavelength of the active layer.

In one embodiment, a polarization-selecting emission is observed from the top or the bottom of the elliptical nanorods or the fin-shaped nano-walls, and the polarization states is linearly, elliptically, or circularly polarized.

In one embodiment, when the first conductive layer is n-typed, then the second conductive layer is p-typed; when the first conductive layer is p-typed, then the second conductive layer is n-typed.

In one embodiment, a third conductive layer is disposed between the substrate and the first conductive layer; when the first conductive layer is n-typed, then the third conductive layer is n-typed; when the first conductive layer is p-typed, then the third conductive layer is p-typed.

In one embodiment, a light-blocking layer is disposed on the substrate between the elliptical nano-rods or the fin-shaped nano-walls.

In one embodiment, a metal layer is disposed on the second conductive layer within each elliptical nano-rod or each fin-shaped nano-wall.

In one embodiment, a transparent electroconductive layer is disposed on the second conductive layer within each elliptical nano-rod or each fin-shaped nano-wall.

In one embodiment, a metal layer is disposed on the transparent electroconductive layer within each elliptical nano-rod or each fin-shaped nano-wall.

Linearly or circularly polarized LEDs can be applied in the current LCD display industry. They can be used to reduce the absorbed light energy by a linear polarizer in front of an un-polarized light source. The energy efficiency will help extend the power consumption of portable devices, such as smart phones or laptop computers. The ability to control the polarization state for each individual emitter can also find applications in 3D display that employs the polarization selecting method. In addition, the claimed concept can also be integrated with a micro-LED or mini-LED, which have demonstrated great potential in the virtual reality (VA) or augmented reality (AR) display technologies. Polarized micro-LEDs or mini-LEDs will be able to develop more interesting applications in the fields of VA or AR.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements. Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up", "down", "left", "right", "vertical", "horizontal", "top", "bottom", "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first", and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount", "link" and/or "connect" should be construed broadly. For example, they may be referred to a fixed connection, detachable connection or connecting integrally, or they may be referred to a mechanical or an electrical connection; or, they may be referred to a direct connection or an indirect connection through an intermediate medium or an inter-communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one", "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

The light-emitting diode, according to various embodiment provided by this disclosure, will be described with reference to FIGS. 1 through 7.

Figure 1:
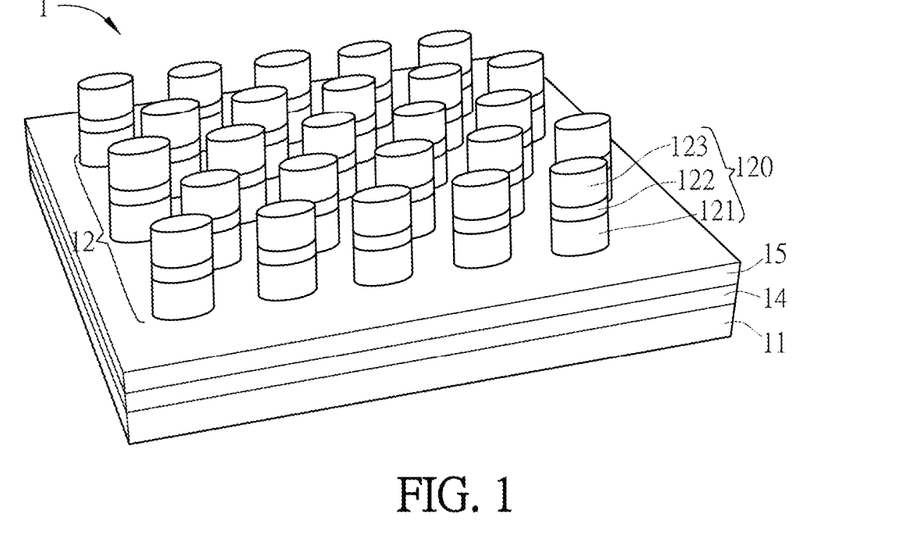
FIG. 1. A schematic diagram of the light-emitting diode according to one embodiment of the present disclosure.

Please refer to FIG. 1, the light-emitting diode 1 according to one embodiment of this disclosure comprises a substrate 11 and an elliptical nano-rod array 12. The elliptical array 12 is disposed on the substrate 11 and comprises a plurality of elliptical nanorods 120 which are perpendicular to the substrate 11. Each nano-rod 120 comprises a first conductive layer 121, an active layer 122, and a second conductive layer 123. In the present embodiment, the first conductive layer 121, the active layer 122, and second conductive layer 123 are consecutively disposed on the substrate 11. The active layer 122 is disposed between the first and the second conductive layers 121 and 123. The first conductive layer 121 may be disposed on the substrate 11. The active layer 122 is disposed on the first conductive layer 121, and the second conductive layer 123 is disposed on the active layer 122. The first and the second conductive layers 121 and 123 can be constituted by an n-typed or p-typed semi-conductive material, such as GaN—, GaAs—, InGaAs—, AlInGaP—, InAs—, ZnSe—, ZnS—, SiC—, and InSe-based semi-conductive materials. When one of the two conductive layer is n-typed, the other is p-typed. In other words, when the first conductive layer is n-typed, then the second conductive layer is p-typed, and when the first conductive layer is p-typed, then the second conductive layer is n-typed. The active layer 122 can be multiple quantum wells constituted by repetitively stacked wells and barriers.

Figure 2:
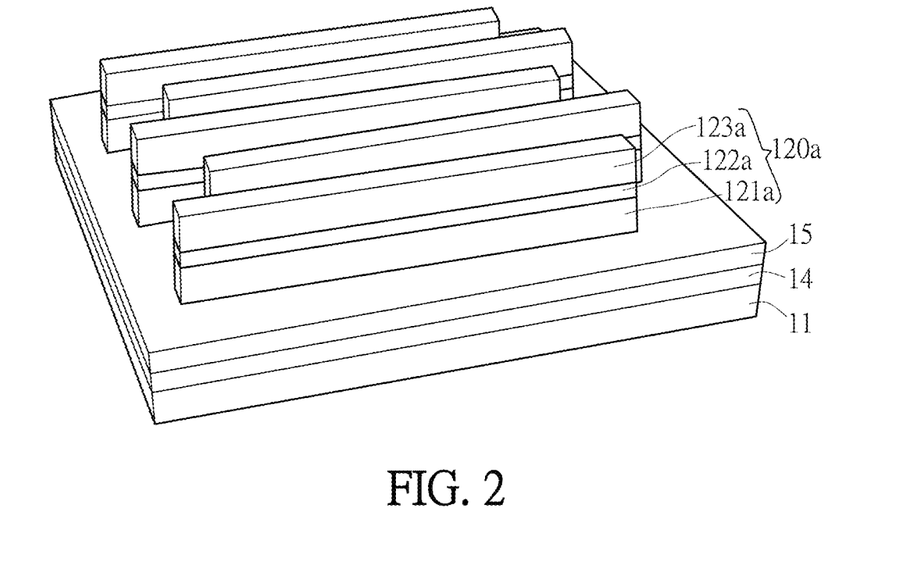
FIG. 2. A schematic diagram of the light-emitting diode according to another embodiment of the present disclosure.

Also, as shown in FIG. 2, the light emitting diode 1 may also comprises a substrate 11 and a plurality of fin-shaped nano-walls 120a. The fin-shaped nano-walls 120a are disposed on the substrate 11 and are perpendicular to the substrate 11. Each fin-shaped nano-wall 120a comprises a first conductive layer 121a, an active layer disposed 122a on the first conductive layer 121a, and a second conductive layer 123a disposed on the active layer 122a. The fin-shaped nano-walls 120a may be parallel to one another.

Figure 4:
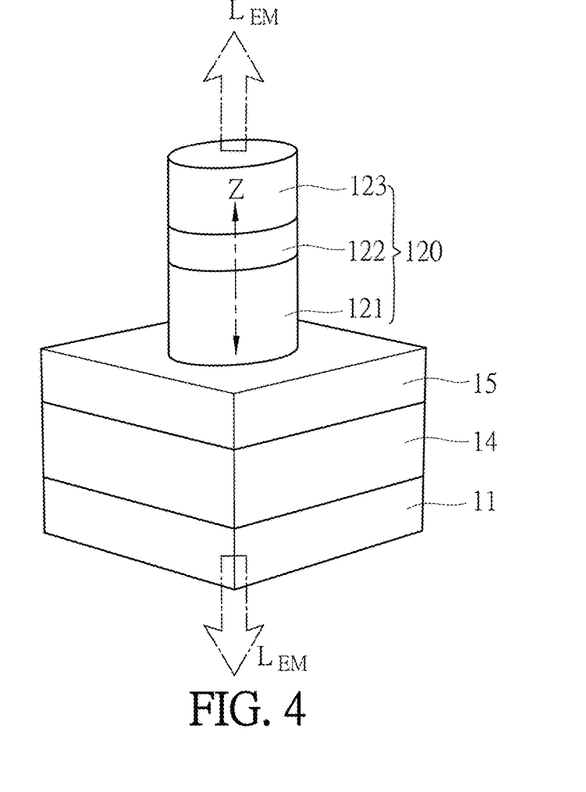
FIG. 4. A schematic diagram depicting the polarization-selective emission of the light-emitting diode shown in FIG. 1.

As illustrated in FIG. 4, the light emitting diode 1 provided by the present embodiment is found to be able to emit polarized light $L_{EM}$ either from the top or the bottom of the elliptical nanorods 120 along the longitudinal axis Z of the nanorods 120. Such polarization-selection emission is demonstrated by the data shown as below. The polarization state of the emission can be linearly, elliptically, or circularly polarized. Moreover, the dimension of the elliptical nanorod 120 (or the fin-shaped nano-wall 120a) is found to be pertinent to such polarization-selection emission. As shown in the following data, the minor axis of each elliptical nanorod 120 (or the linewidth of the fin-shaped nano-wall 120a) can be smaller than half of the working wavelength of the active layer 122, and more preferably smaller than or equal to one-third thereof. The "working wavelength" of the active layer 122 refers to the wavelength of the light emitted by the active layer when the light-emitting diode is working, and it varies with the material(s) which constitute(s) the active layer 122. For example, when the active layer is InGaN/GaN multiple quantum wells which emits light at 450 nm, the minor axis of the elliptical nanorod 120 (or the linewidth of the fin-shaped nano-wall 120a) can be designed to be smaller than 225 nm, or, to be as narrow as 150 to 200 nm. The aforementioned dimensions of the nanorods 120 (or fin-shaped nano-walls 120a), materials of the active layer 122 and the numeric value of the working wavelength thereof is only an example and this disclosure is not limited thereto.

As shown in FIGS. 1 and 2, a third conductive layer 14 may be further disposed between the substrate 11 and the first conductive layer 121. The third conductive layer 14 and the first conductive layer 121 can be made of the same semi-conductive material(s). In other words, when the first conductive layer 121 is n-typed, then the third conductive layer 14 is n-typed, and when the first conductive layer 121 is p-typed, then the third conductive layer 14 is p-typed. The third conductive layer 14 disposed between the substrate 11 and the first conductive layer 121 can help simplify the electric connection to each elliptical nanorod 120 (or fin-shaped nano-wall 120a). Moreover, a light-blocking layer 15 can be disposed on the substrate 11 or the third conductive layer 14 (as shown in the drawings) between the elliptical nanorods 120 or fin-shaped nano-wall 120a. The light-blocking layer 15 may improve the polarization selectivity of the light-emitting diode 1.

Figure 3A:
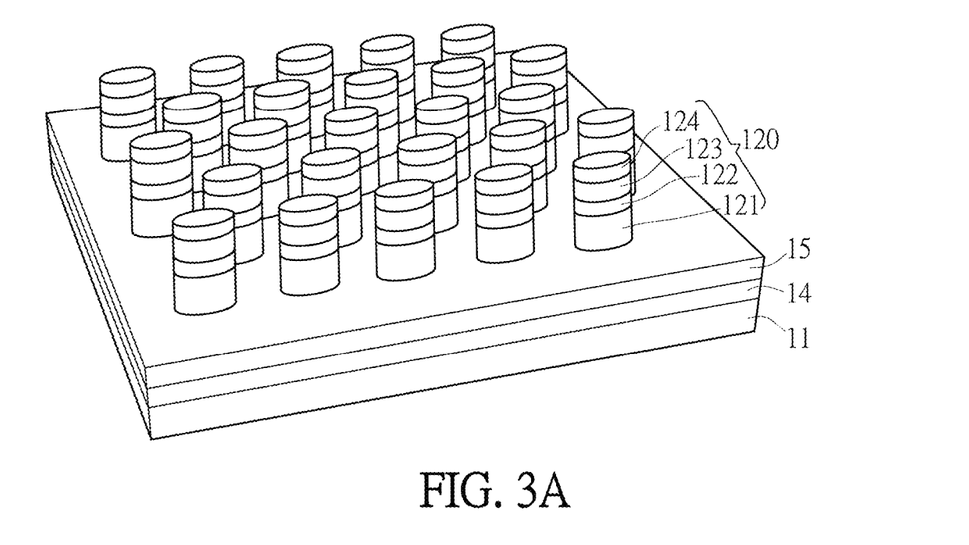
FIGS. 3A and 3B. Schematic diagrams of the light-emitting diode shown in FIG. 1 with four- and five-layered nanorods, respectively.
Figure 3B:
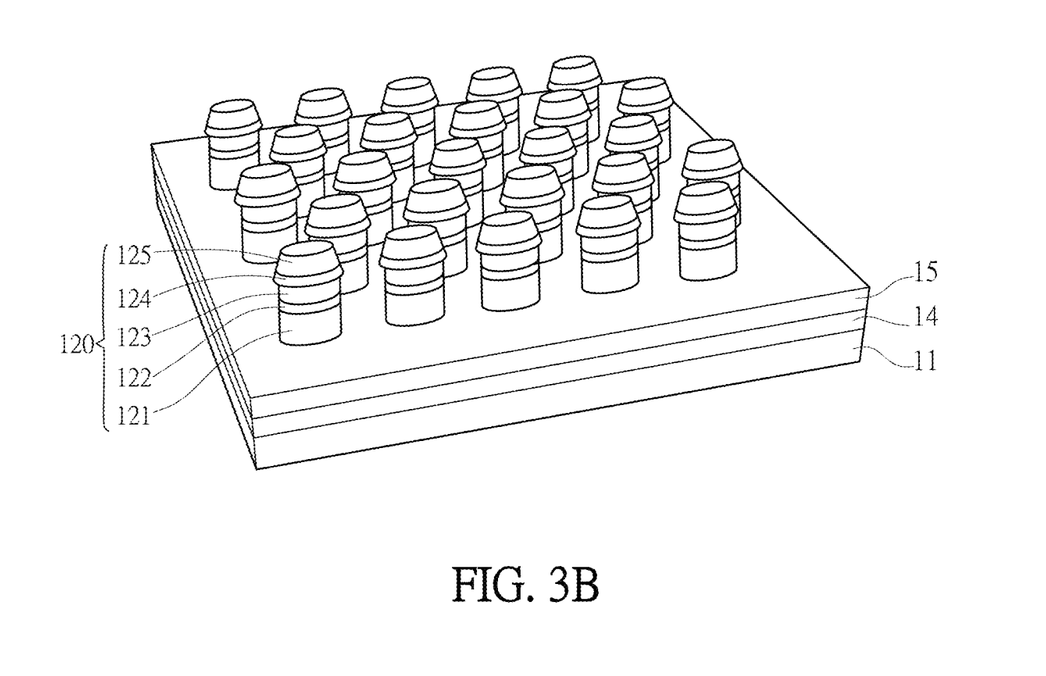

As shown in FIGS. 3A and 3B, according to other practicing types of the present embodiment, the elliptical nanorods 120 of the nanorod array 12 may have a four-layered or five-layered structure rather than the three-layered structure shown in FIG. 1. In FIG. 3A, a metal layer 125 can be disposed on the second conductive layer 123 within each elliptical nanorod 120. The metal layer 125 helps to obtain electric contact to the second conductive layer 123 with the electrode which can be mounted on the nanorods 120. Alternatively, in FIG. 3B, a transparent electroconductive layer 124 is first disposed on the second conductive layer 123 within each elliptical nanorod 120 to help to obtain Ohmic contact to the second conductive layer 123, and then the metal layer 125 is disposed on the transparent electro-conductive layer 124 to help to obtain electric contact to the transparent electroconductive layer 124. It should be noted that those who have an ordinary skill in the art may also appreciated that the fin-shaped nano-walls 120a may have those similar (or the same) afore-described four- or five-layered structures.

Figure 3C:
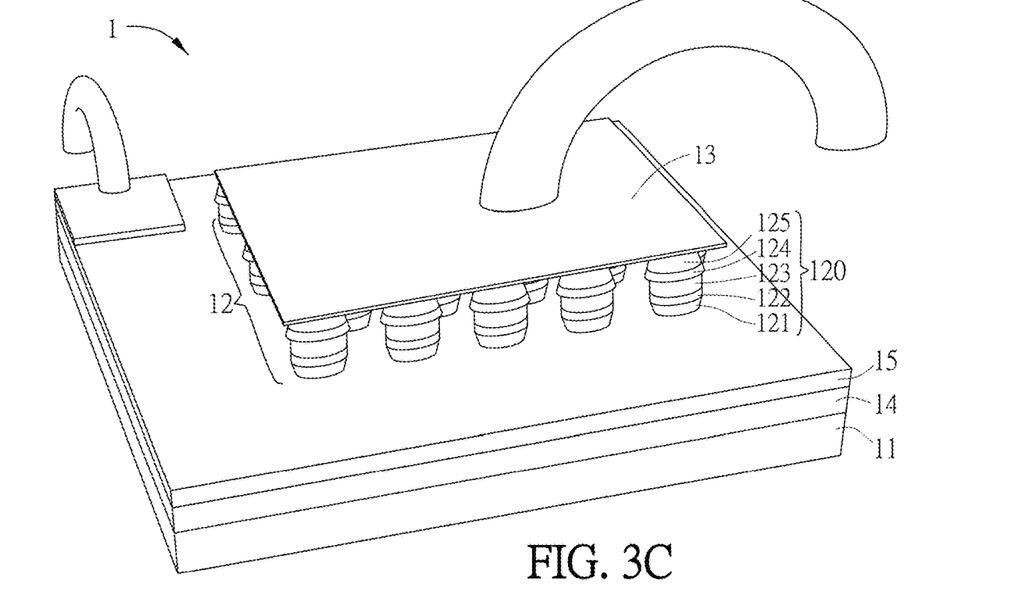
FIG. 3C A schematic diagram of the light-emitting diode shown in FIG. 1 with metal pads (served as positive and negative electrode) mounted on the elliptical nanorod array and on top of the planar area of the conductive layer.

As shown in FIG. 3C, the light emitting diode 1 may further comprises two electrodes 13 disposed on the elliptical nanorod array 12 (or the fin-shaped nano-walls 120a, which is not shown) and on top of the planar area of the third conductive layer 14, such that electric currents can be injected into the elliptical nanorod array 12 (or the fin-shaped nano-walls 120a) to prompt the light-emitting diode 1 to emit polarized light from the top or the bottom of the elliptical nanorod array 12 (or the fin-shaped nano-walls 120a). The electrode 13 which is mounted on the elliptical nanorod array 12 or the fin-shaped nano-walls 120a can be a metal pad and commonly connect to each elliptical nanorod 120 or fin-shaped nano-wall 120a, so as to make good electric contact to the top of the nanorods 120 or the fin-shaped nano-walls 120a.

To illustrate the functions and characteristics of the light-emitting diode provided by the present disclosure, there are several examples shown below.

Nanofabrication of the Nano-Rods and Nano-Walls

The asymmetric nanostructures used in this study can be fabricated with a top-down nanofabrication approach. The hard masks are two-dimensional nano-ellipses arrays or one-dimensional nanowire array made from Ni, which can be fabricated using conventional nanofabrication methods, such as electron beam lithography (EBL) or nano-imprint lithography (NIL). The length of the minor axis of each nano-ellipses or the linewidth of the nanowire is controlled to be around 200 nm. The elliptical nanorods or Fin-shaped nanowall can be obtained after regular dry ICP etch. Additional wet etch can be applied to smoothen the etch surface. The resulting length of minor axis of the elliptical rod is smaller than 200 nm, which is smaller than half of the operating wavelength at 450 nm. The sidewall of the nano-structures can be vertical and extremely smooth.

Electrical Connection

These vertically aligned nano-rods or nano-walls are electrically connected through the first conduction layer on the substrate, which is an n-type semiconductor in this case. A metal pad fabricated on top of the planar area of the n-type semiconductor serves as the electrode. The other electrode is a thin metal pad that is placed on top of the nano-rods or nano-walls. Electric current is applied to these nano LEDs between these two electrodes and regular electrical and optical measurements are performed.

Electric Measurements to Demonstrate Linearly Polarized Emission

Figure 5A:
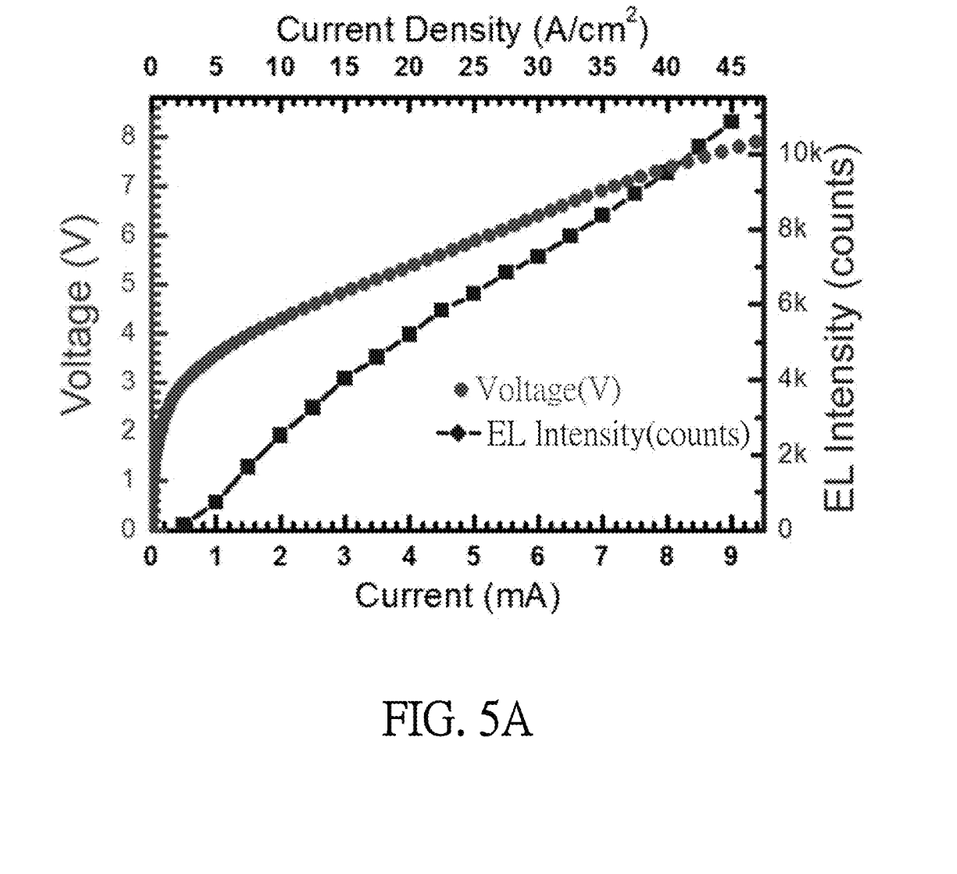
FIG. 5A illustrates the nominal L-I-V curve for the current-injecting nanorod LEDs.
Figure 5B:
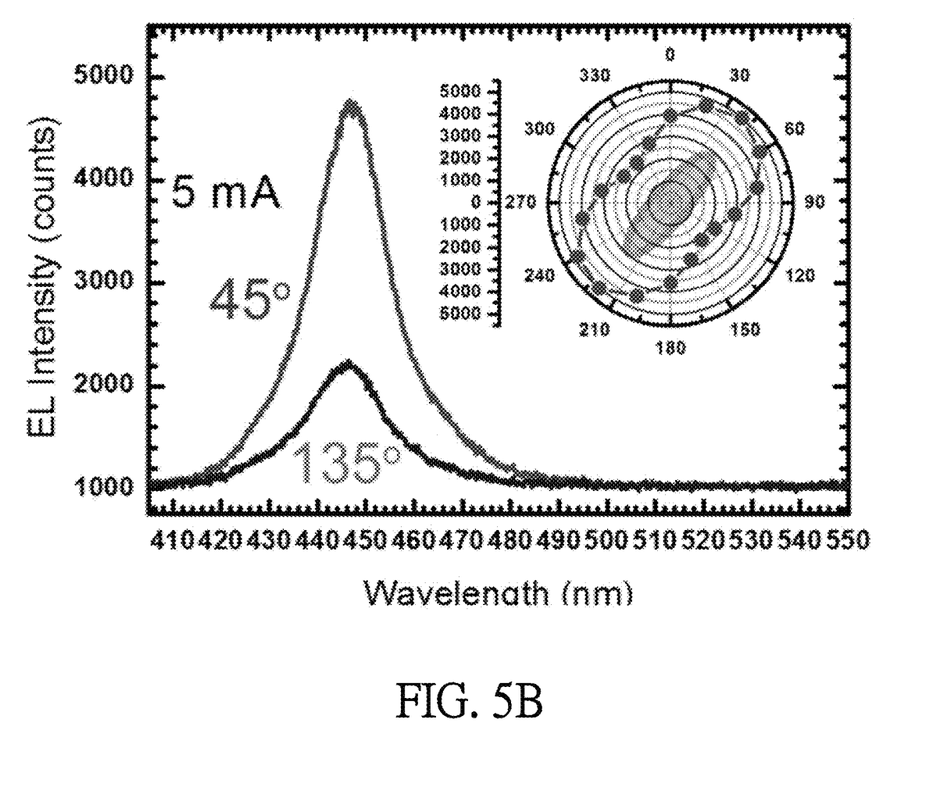
FIG. 5B illustrates 450 nm EL measured when the polarizer is at 45 and 135 degree. The polarized peak value of the EL is demonstrated in the inset. The highest occurs when the polarizer is rotated to an angle that is parallel to the polarizer.

In this case, electric current is applied to both contacts with a sourcemeter. FIG. 5A illustrates the light intensity-current-voltage (LIV) characteristics of the elliptical nanorod LEDs. The turn-on voltage is close to 3 V. Because the Ni pads on top of the nanorods are very thick (>50 nm), the emitted light is not allowed to transmit through and EL from these nanorods LEDs can only be detected from the bottom. P is measured. The measured EL detected from the bottom side reveals very little polarization selectivity. The polarization ratio only reaches 52%. The possible cause for the low polarization selectivity is probably due to the emitted EL from the topside can be scattered by the nanorods and reaches the bottom side. Therefore, a thin layer of Ni is deposited on the open area of the substrate to block the EL from the topside to reach the bottom side. Polarization-dependent EL measured from the bottom side of the samples with the light-blocking layer is illustrated in FIG. 5B. EL reaches its maximum when the polarizer is rotated to 45°, which is parallel to the major axis of the elliptical nanorods. The minimum occurs at 135° with a polarization ratio of 71%. The polarization ratio (P) is defined as Ix/(Ix+Iy). Inset of FIG. 5B is the PL peak intensity at different polarization direction.

Electromagnetic Simulation to Demonstrate Linearly Polarized Emission

Figure 6A:
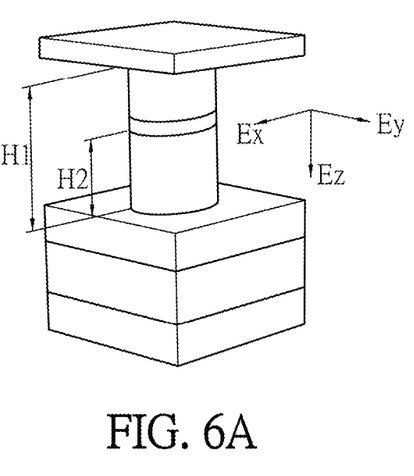
FIGS. 6A and 6B are schematic illustrations of the sample structures used for simulation. Da and Db indicate the long and short axis of the nano-ellipse. The height of the rod (H1) is 735 nm and the light emitter is situated at H2 from the bottom of the rod. A Ni metal pad covers entirely the top of the rod and the surface without the rod is also covered with a thin layered of $Ni/SiO_2$.
Figure 6B:
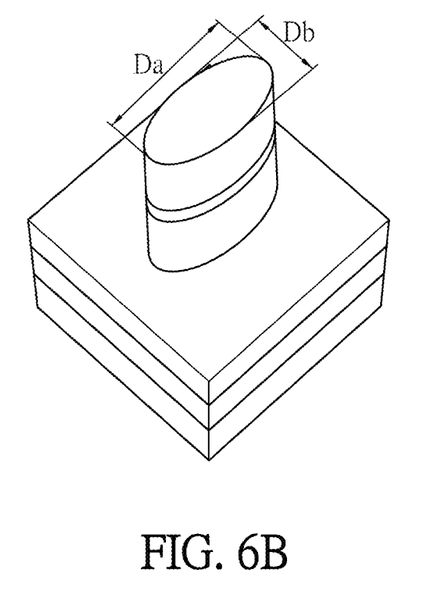
Figure 6C:
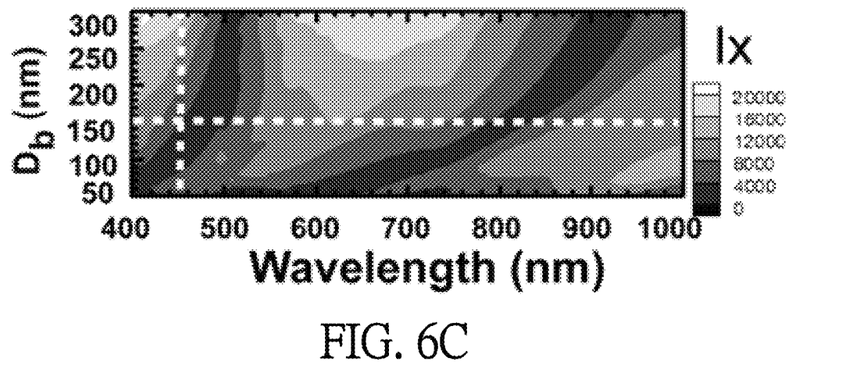
FIGS. 6C and 6D are contour maps of the polarized intensity for the x- and y-polarized light measured from the bottom of the sample.
Figure 6D:
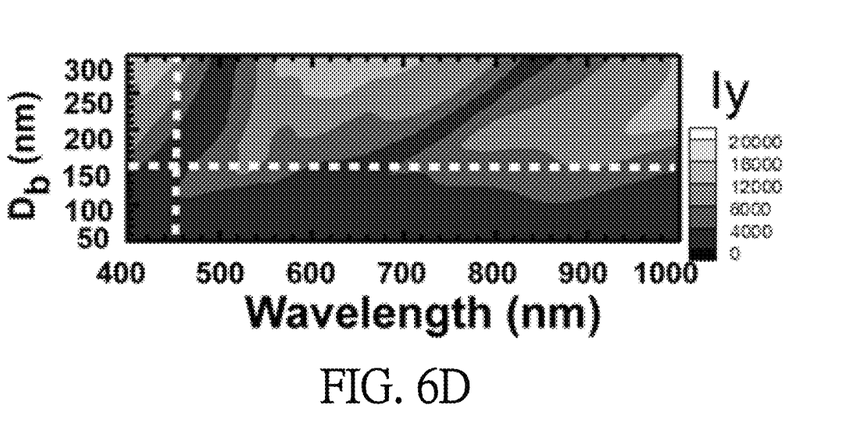
Figure 6E:
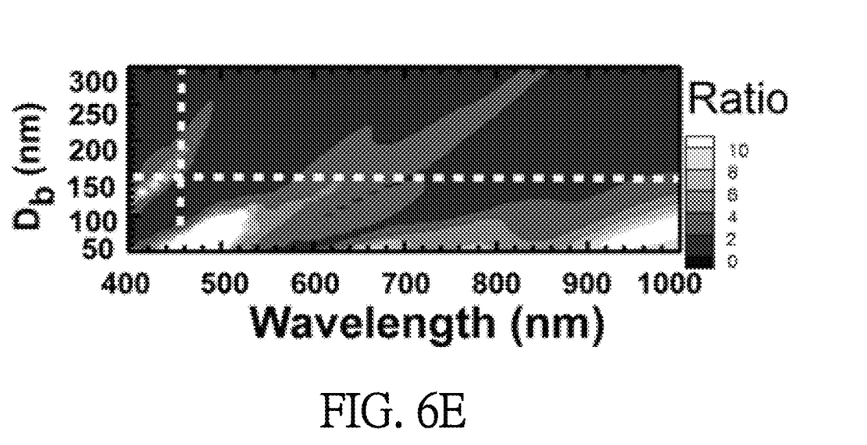
FIG. 6E illustrates the polarization ratio define by Ix/(Ix+Iy). The white dashed line indicates the emission wavelength of the LED under investigation.

Electromagnetic simulation using three-dimensional finite difference time-domain (3D-FDTD) method was performed to explain the polarization selectivity of the EL measurements. FIGS. 6A and 6B illustrate the structures of the simulated devices where an elliptical nanorods with height of $H_1$ (735 nm) is located on top of the substrate. Da and Db are the lengths of the major and minor axes of the nano-ellipses. Da is not varied and equal to 600 nm. The light source in located within the plane that is located at a distance of H2 (405 nm) from the surface. A thick layer of metal caps the nanorods. Refractive index of the substrate and the nanorods are assumed to be the same at 2.4. The surface area in-between nanorods is covered with a thin layer of metal (20 nm) and $SiO_2$ (140 nm). FIGS. 6C and 6D illustrate the transmitted EL spectra for the x- and y-polarization with varying Db. The polarization ratio at different wavelength with varying Db is illustrated in FIG. 6E. When the Db is close to 300 nm, the polarization ratio across the whole spectrum is close to 0.50 indicating the transmitted EL for the x- and y-polarization are very similar and does not exhibit a preferred polarization direction. EL spectra for both polarizations reveal periodic up and down behavior that is probably due to the constructive or destructive interferences between the light directly from the light source and the reflected light by the top metal layer. With the reducing Db, EL for the x- and y-polarization start to deviate from each other and EL for the x-polarization starts to dominate at certain wavelength. Since the current LED emit light at 450 nm, Db has to be around 150 nm in order for the x-polarization starts to dominate. Results from the simulation further confirm the polarized EL spectra measured experimentally.

Electromagnetic Simulation to Demonstrate Elliptically Polarized Emission

Figure 7A:
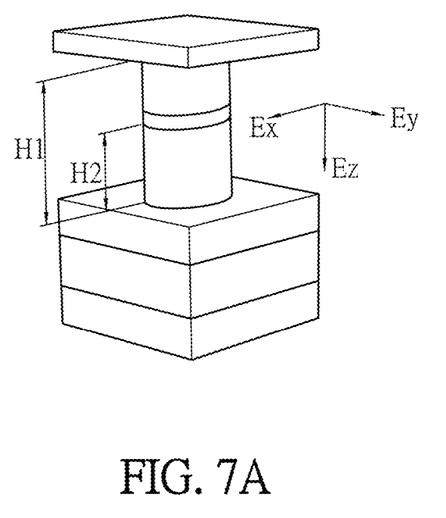
FIGS. 7A and 7B illustrate the structures of the simulated devices where an elliptical nanorods with varying height of H1. Da is equal to 600 nm and Db is equal to 150 nm. The light source is located within the plane that is located at a distance of H2 from the surface and the distance between the top metal layer to the light source is equal to 200 nm (H1−H2).
Figure 7B:
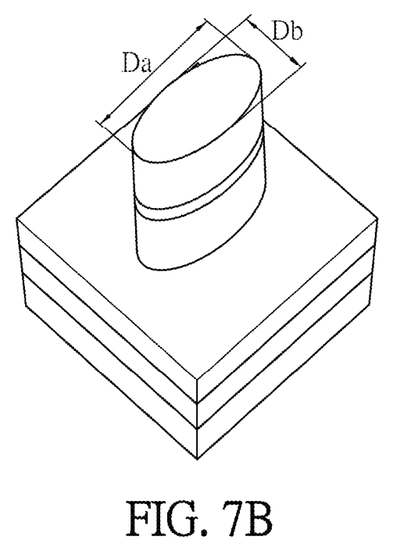
Figure 7C:
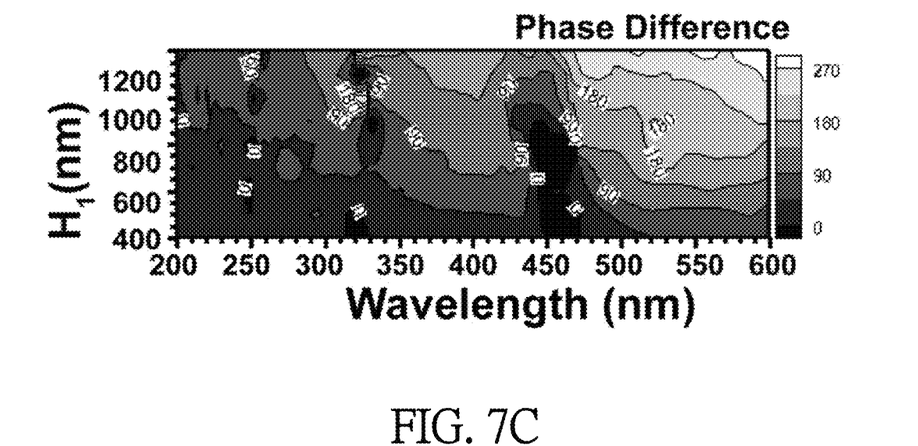
FIG. 7C illustrates the phase difference between the transmitted x- and y-polarized EL with varying H1. When the phase difference is 90° or 270°, the emission is circular polarized. When the phase difference is 0° or 180°, the emission is linear polarized. For other phase difference, the emission is elliptical polarized.

Electromagnetic simulation using 3D-FDTD method was performed again to demonstrate the possible polarization states that can be obtained. The nanostructures used in this study is the elliptical nanorod. FIGS. 7A and 7B illustrate the structures of the simulated devices where an elliptical nanorods with varying height of H1. Da is equal to 600 nm and Db is equal to 150 nm. The light source in located within the plane that is located at a distance of $H_2$ from the surface and the distance between the top metal layer to the light source is equal to 200 nm (H1–H2). FIG. 7C illustrates the phase difference between the transmitted x- and y-polarized EL with varying H1. When the phase difference equals to either 0° or 180°, the corresponding polarization state is linearly polarized light. When the phase difference equal to 90° or 270°, the corresponding polarization state is left-circularly or right-circular polarized light, respectively. Other phase difference represents elliptically polarized light. Results from the simulation indicates that it is possible to obtain either linearly, elliptically, or circularly polarized light using this device configuration.

Conclusion

In this case, this disclosure has successfully demonstrated that elliptical nanorod LEDs can emit polarized light that can be detected from the backside of the substrate. The polarization ratio reaches 70% when the length of the minor axis is close to 150 nm. Theoretical electromagnetic simulation confirms that that the emitted light is highly polarized when the minor axis is very small. Simulation also confirms that the polarization states can also be elliptically or circularly polarized. The same phenomena can also be adapter to other types of nanostructure, such as the fin-shaped nano-wall also in this invention. These nanostructures can be easily fabricated using a top-down two-step dry eth process. The required hard mask can be fabricated using standard nanofabrication method, such as electron-beam lithography or nano-imprint lithography. These fabrication procedures are both low cost and compatible for current semiconductor manufacturing processes. Results in this study will be especially beneficial for applications that required polarized light or devices that are not suitable to use an external polarizer. These results will find suitable applications in several display technologies, micro-LEDs and should be appealing for the researchers worldwide and attract greater industrial attention.

REFERENCES

1. Nakamura, S.; Mukai, T.; Senoh, M., Candela-Class High-Brightness Ingan/Algan Double-Heterostructure Blue-Light-Emitting Diodes. *Appl Phys Lett* 1994, 64 (13), 1687-1689.
2. Nakamura, S.; Senoh, M.; Nagahama, S.; Iwasa, N.; Yamada, T.; Matsushita, T.; Kiyoku, H.; Sugimoto, Y, InGaN-based multi-quantum-well-structure laser diodes. *Jpn J Appl Phys 2* 1996, 35 (1b), L74-L76.
3. Nakamura, S.; Krames, M. R., History of Gallium-Nitride-Based Light-Emitting Diodes for Illumination. *P Ieee* 2013, 101 (10), 2211-2220.
4. Cho, J.; Park, J. H.; Kim, J. K.; Schubert, E. F., White light-emitting diodes: History, progress, and future. *Laser Photonics Rev* 2017, 11 (2).
5. Pimputkar, S.; Speck, J. S.; DenBaars, S. P.; Nakamura, S., Prospects for LED lighting. *Nat Photonics* 2009, 3 (4), 179-181.
6. Schubert, M. F.; Chhajed, S.; Kim, J. K.; Schubert, E. F.; Cho, J., Polarization of light emission by 460 nm GaInN/GaN light-emitting diodes grown on (0001) oriented sapphire substrates. *Appl Phys Lett* 2007, 91 (5).
7. Paskov, P. P.; Paskova, T.; Holtz, P. O.; Monemar, B., Anisotropy of the free exciton emission in GaN grown on a-plane sapphire. *Physica Status Solidi a-Applied Research* 2002, 190 (1), 75-79.
8. Gardner, N. F.; Kim, J. C.; Wierer, J. J.; Shen, Y. C.; Krames, M. R., Polarization anisotropy in the electroluminescence of m-plane InGaN—GaN multiple-quantum-well light-emitting diodes. *Appl Phys Lett* 2005, 86 (11).
9. Brinkley, S. E.; Lin, Y. D.; Chakraborty, A.; Pfaff, N.; Cohen, D.; Speck, J. S.; Nakamura, S.; DenBaars, S. P., Polarized spontaneous emission from blue-green m-plane GaN-based light emitting diodes. *Appl Phys Lett* 2011, 98 (1).
10. Cho, J.; Meyaard, D. S.; Ma, M.; Schubert, E. F., GaInN-based light emitting diodes embedded with wire grid polarizers. *Jpn J Appl Phys* 2015, 54 (2).
11. Zhuang, Z.; Li, Y.; Liu, B.; Guo, X.; Dai, J. P.; Zhang, G. G.; Tao, T.; Zhi, T.; Xie, Z. L.; Ge, H. X.; Shi, Y.; Zheng, Y. D.; Zhang, R., Optical polarization characteristics of c-plane InGaN/GaN asymmetric nanostructures. *J Appl Phys* 2015, 118 (23).
12. Zhuang, Z.; Guo, X.; Liu, B.; Hu, F. R.; Dai, J. P.; Zhang, Y.; Li, Y.; Tao, T.; Zhi, T.; Xie, Z. L.; Ge, H. X.; Wang, X. Y.; Xiao, M.; Wang, T.; Shi, Y.; Zheng, Y. D.; Zhang, R., Great enhancement in the excitonic recombination and light extraction of highly ordered InGaN/GaN elliptic nanorod arrays on a wafer scale. *Nanotechnology* 2016, 27 (1).
13. Chen, H. Y.; Yang, Y. C.; Lin, H. W.; Chang, S. C.; Gwo, S., Polarized photoluminescence from single GaN nanorods: Effects of optical confinement. *Opt Express* 2008, 16 (17), 13465-13475.
14. Lu, Y. J.; Lin, H. W.; Chen, H. Y.; Yang, Y. C.; Gwo, S., Single InGaN nanodisk light emitting diodes as full-color subwavelength light sources. *Appl Phys Lett* 2011, 98 (23).
15. Zhao, C.; Ng, T. K.; Wei, N. N.; Prabaswara, A.; Alias, M. S.; Janjua, B.; Shen, C.; Ooi, B. S., Facile Formation of High-Quality InGaN/GaN Quantum-Disks-in-Nanowires on Bulk-Metal Substrates for High-Power Light-Emitters. *Nano Lett* 2016, 16 (2), 1056-1063.
16. Li, Q. M.; Westlake, K. R.; Crawford, M. H.; Lee, S. R.; Koleske, D. D.; Figiel, J. J.; Cross, K. C.; Fathololoumi, S.; Mi, Z. T.; Wang, G. T., Optical performance of top-down fabricated InGaN/GaN nanorod light emitting diode arrays. *Opt Express* 2011, 19 (25), 25528-25534.
17. Ke, M. Y.; Wang, C. Y.; Chen, L. Y.; Chen, H. H.; Chiang, H. L.; Cheng, Y. W.; Hsieh, M. Y.; Chen, C. P.; Huang, J. J., Application of Nanosphere Lithography to LED Surface Texturing and to the Fabrication of Nanorod LED Arrays. *Ieee J Sel Top Quant* 2009, 15 (4), 1242-1249.
18. Zhao, C.; Ng, T. K.; Prabaswara, A.; Conroy, M.; Jahangir, S.; Frost, T.; O'Connell, J.; Holmes, J. D.; Parbrook, P. J.; Bhattacharya, P.; Ooi, B. S., An enhanced surface passivation effect in InGaN/GaN disk-in-nanowire light emitting diodes for mitigating Shockley-Read-Hall recombination. *Nanoscale* 2015, 7 (40), 16658-16665.

What is claimed is:

1. A light-emitting diode, comprising:
   a substrate,
   an elliptical nano-rod array which is disposed on the substrate and comprises a plurality of elliptical nanorods which are perpendicular to the substrate, wherein each nano-rod comprises a first conductive layer, an active layer disposed on the first conductive layer, and a second conductive layer disposed on the active layer,
   wherein a narrowest dimension of the elliptical nanorods is less than one-third of an emitting wavelength of the active layer and electric currents are injected into the elliptical nano-rod array to prompt the light-emitting diode to emit polarized light,
   wherein a light-blocking layer is disposed on the substrate between the elliptical nano-rods.

2. The light-emitting diode according to claim 1, wherein each elliptical nano-rod comprises a minor axis which is smaller than half of the working wavelength of the active layer.

3. The light-emitting diode according to claim 1, wherein a polarization-selecting emission is observed from the top or the bottom of the elliptical nano-rods, and the polarization states is linearly, elliptically, or circularly polarized.

4. The light-emitting diode according to claim 1, wherein when the first conductive layer is n-typed, then the second conductive layer is p-typed; when the first conductive layer is p-typed, then the second conductive layer is n-typed.

5. The light-emitting diode according to claim 4, wherein a third conductive layer is disposed between the substrate and the first conductive layer; when the first conductive layer is n-typed, then the third conductive layer is n-typed; when the first conductive layer is p-typed, then the third conductive layer is p-typed.

6. The light-emitting diode according to claim 1, wherein a metal layer is disposed on the second conductive layer within each elliptical nano-rod.

7. The light-emitting diode according to claim 1, wherein a transparent electroconductive layer is disposed on the second conductive layer within each elliptical nano-rod.

8. The light-emitting diode according to claim 7, wherein a metal layer is disposed on the transparent electroconductive layer within each elliptical nano-rod.

9. A light-emitting diode, comprising:
a substrate,
a plurality of fin-shaped nano-walls which are disposed on the substrate and are perpendicular to the substrate, wherein each fin-shaped nano-wall comprises a first conductive layer, an active layer disposed on the first conductive layer, and a second conductive layer disposed on the active layer,
wherein a narrowest dimension of the fin-shaped nano-walls is less than one-third of an emitting wavelength of the active layer and electric currents are injected into the fin-shaped nano-walls to prompt the light-emitting diode to emit polarized light,
wherein a light-blocking layer is disposed on the substrate between the fin-shaped nano-walls.

10. The light-emitting diode according to claim 9, wherein each fin-shaped nano-wall comprises a linewidth which is smaller than half of the working wavelength of the active layer.

11. The light-emitting diode according to claim 9, wherein a polarization-selecting emission is observed from the top or the bottom of the fin-shaped nano-walls, and the polarization state of the emission is linearly, elliptically, or circularly polarized.

12. The light-emitting diode according to claim 9, wherein when the first conductive layer is n-typed, then the second conductive layer is p-typed; when the first conductive layer is p-typed, then the second conductive layer is n-typed.

13. The light-emitting diode according to claim 12, wherein a third conductive layer is disposed between the substrate and the first conductive layer; when the first conductive layer is n-typed, then the third conductive layer is n-typed; when the first conductive layer is p-typed, then the third conductive layer is p-typed.

14. The light-emitting diode according to claim 9, wherein a metal layer is disposed on the second conductive layer within each fin-shaped nano-wall.

15. The light-emitting diode according to claim 9, wherein a transparent electroconductive layer is disposed on the second conductive layer within each fin-shaped nano-wall.

16. The light-emitting diode according to claim 15, wherein a metal layer is disposed on the transparent electroconductive layer within each fin-shaped nano-wall.

* * * * *